(12) United States Patent
Akkiraju

(10) Patent No.: US 6,910,195 B2
(45) Date of Patent: Jun. 21, 2005

(54) FLIP-FLOP INSERTION IN A CIRCUIT DESIGN

(75) Inventor: Nataraj Akkiraju, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 10/359,380

(22) Filed: Feb. 5, 2003

(65) Prior Publication Data

US 2004/0153984 A1 Aug. 5, 2004

(51) Int. Cl.[7] ............................................. G06F 17/50
(52) U.S. Cl. .................... 716/6; 716/4; 716/5
(58) Field of Search ................... 716/6, 4, 5

(56) References Cited

U.S. PATENT DOCUMENTS 6,117,182 A    9/2000 Alpert et al.
6,550,044 B1 * 4/2003 Pavisic et al. ................. 716/6

OTHER PUBLICATIONS

Fishburn,"Clock Skew Optimization",Jul. 1990, IEEE Transactions on Computers, vol. 39, iss. 7, pp. 945–951.*
Vesterbacka,"A Static CMOS Master–Slave Flip–Flop Experiment",Dec. 2000, IEEE 7th International Conference on Electronics Circuits and Systems, vol. 2, pp. 870–873.*
Cocchini, Pasquale , "Concurrent Flip–Flop and Repeater Insertion for High Performance Integrated Circuits", *IEEE/ACM International Conference on Computer Aided Design. IEEE/ACM Digest of Technical Papers*, (2002),268–273.

Hassoun, Soha , "Optimal Buffered Routing Path Constructions for Single and Multiple Clock Domain Systems", *IEEE/ACM International Conference on Computer Aided Design. IEEE/ACM Digest of Technical Papers*, IEEE No. 0–7803–7607–2/02; IBM Austin Research Laboratory, Austin, TX,(2002),pp. 247–253.
Lillis, J , et al., "Optimal wire sizing and buffer insertion for low power and a generalized delay model", *IEEE Journal of Solid–State Circuits, 31(3)*, (Mar. 1996),437–447.
Lu, Ruibing , et al., "Flip–Flop and Repeater Insertion for Early Interconnect Planning", *Proceedings 2002 Design, Automation and Test in Europe Conference and Exhibition*, (2002),690–695.
Lukas P.P.P. Van Ginneken; Buffer Placement in Distributed RC–tree Networks for Minimal Elmore Delay; 1990 IEEE.

* cited by examiner

Primary Examiner—Vuthe Siek
Assistant Examiner—Sun James Lin
(74) Attorney, Agent, or Firm—Schwegman, Lundberg, Woessner & Kluth, P.A.

(57) ABSTRACT

A method and apparatus for inserting flip-flops in a circuit design between a driver and one or more receiver(s) comprising generating a candidate solution to assign the flip-flop at the node in the circuit, calculating a margin at the driver, calculating the margin at the receiver, and inserting the flip-flop at the node to simultaneously maximize the margin at the driver and the margin at the receiver. Furthermore, the method and apparatus determines whether to insert a second flip-flop at a second node in the circuit, and inserting the second flip-flop at the second node in the circuit such that a delay between the flip-flop and the second flip-flop is substantially equal to a clock period.

23 Claims, 6 Drawing Sheets

1. InsertFlops(u)
2. If (u is a sink node)
3. $S_u = (f_u, t_u)$
4. return
5. for each $v \in children(u)$
6. InsertFlops(v)
7. $S_u^{\Phi} = \{\}$
8. for each $v \in children(u)$
9. $S = \{\}$
10. for each $s = (f, t) \in S_v$
11. $e = (u, v)$
12. $S = S \cup (f, t - Bufferdelay(e))$
13. $S_u^{\Phi} = Merge(S_u^{\Phi}, S)$
14. $S_u^{\Delta} = \{\}$
15. for each $s = (f, t) \in S_u^{\Phi}$
16. if $(f > 0)$
17. $flop\_rat = f * clock\_period$
18. $margin = t - flop\_rat$
19. $S_u^{\Phi} = S_u^{\Delta} \cup (f-1, flop\_rat; margin)$
20. prune $S_u^{\Delta}$
21. $S_u = S_u^{\Phi} \cup S_u^{\Delta}$

Fig. 4

1. Merge $(S_u, S_v)$
2. If $S_u = \Phi$ return $S_v$
3. $S = \{\}$
4. $i=1, j=1$
5. while $i \leq |S_v|$ and $j \leq |S_v|$
6. $(f_i, t_i) = S_u[i]$, $(f_j, t_j) = S_p[j]$
7. if $f_i > f_j$, $j=j+1$
8. else if $f_i < f_j$, $i=i+1$
9. else $S = S \cup (f_i, \min(t_i, t_j)$
10. return $S$

*Fig.5*

1. Prune $(S_1, S_2)$
2. If($margin(S_1)>0$ and $margin(S_2)>0$)
3. delete solution with greater margin
4. return
5. delete solution with smaller margin
6. return

Fig. 6

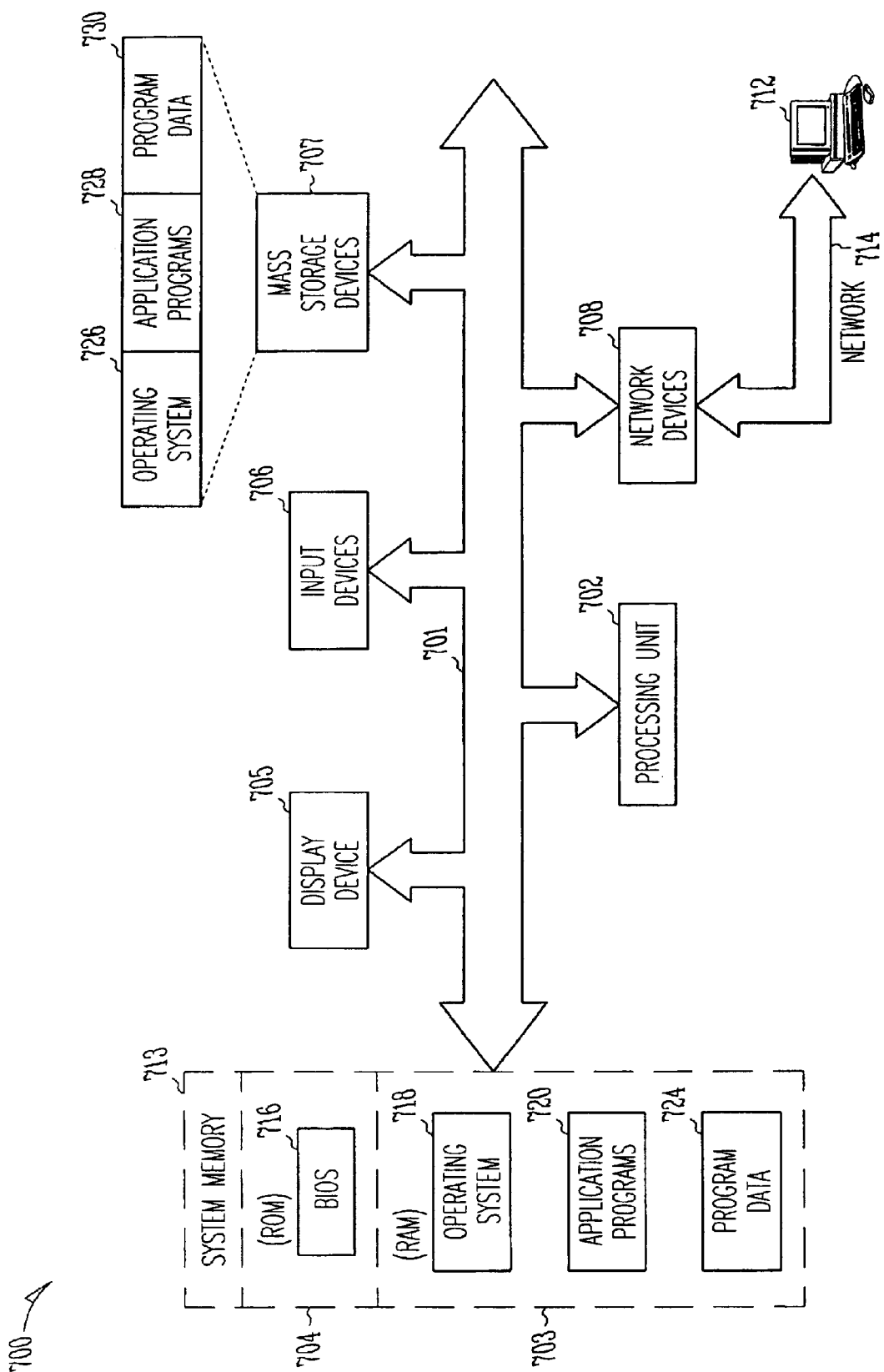

FLIP-FLOP INSERTION IN A CIRCUIT DESIGN

BACKGROUND

1. Field of the Invention

The present invention is related to the field of circuit design. In particular, the present invention is related to method and apparatus to insert flip-flops in a circuit design.

2. Description of the Related Art

Interconnect optimization is a critical component of circuit design, and in particular, of Very Large Scale Integration (VLSI) circuit design. As part of interconnect optimization of a VLSI circuit design, repeaters (e.g., buffers and inverters) are used to reduce interconnect delay and to meet transition time/noise constraints. However, merely using repeaters does not solve all timing requirements; for example, when wire delay is greater than a clock cycle, the mere addition of repeaters may not solve the timing constraints and the insertion of flip-flops/latches is essential. If the VLSI circuit is deeply pipelined, the number of flip-flops in the circuit is significant and an automated tool to insert flip-flops in the circuit design is necessary to reduce the Register-Transfer-Level (RTL)-to-layout convergence time.

Typically, the RTL specification determines the number of clock cycles required for each driver-receiver path in the design. When data from a driver requires more than one clock cycle to reach a receiver, a flip-flop is typically added to the RTL specification of the circuit design. However, to determine the physical placement of the flip-flops in the VLSI circuit design, an automatic flip-flop insertion method may be necessary to optimize the physical placement of the flip-flops based on the RTL specifications.

Conventional flip-flop insertion methods insert flip-flops in the circuit to meet latency constraints by using heuristic techniques which are sub optimal. FIG. 1 illustrates flip-flops placed in a circuit using a conventional flip-flop insertion method. FIG. 1 illustrates a circuit 100 having two branches wherein each branch has a sink node (receiver) $s_1$ and $s_2$ respectively and a source node (driver) $v_d$ to drive the sink nodes $s_1$ and $s_2$. The RTL specification provides the required arrival times ($t_{req}$) at $s_1$ and $s_2$ as $t_1$ and $t_2$ pico seconds (psec) after the positive edge of a clock, and also provides the time period of the clock ($t_c$) that drives the source node $v_d$. In addition, the RTL specification provides additional constraints e.g., limiting one flip-flop on the path $p(v_d, s_1)$ from the driver $v_d$ to the receiver $s_1$, and limiting 2 flip-flops on the path $p(v_d, s_2)$ from the driver $v_d$ to the receiver $s_2$. As FIG. 1 illustrates, a conventional flip-flop insertion method places a flip-flop F on path $p(v_d,s_1)$ at $t_1$ psec away from $s_1$ and $t_2$ psec away from $s_2$ on path $p(v_d,s_2)$. In accordance with the constraint requirements, a second flip-flop F is placed a clock cycle, $t_c$ psec, away from the first flip-flop on path $p(v_d,s_2)$ toward the driver before branch junction 105. Thus, conventional flip-flop insertion methods place flip-flops in the circuit by utilizing the required arrival time constraint given at the receiver to fix the position of the last flip-flop on the path from the driver to the receiver, and subsequent flip-flops, if specified, are placed a clock cycle away between flip-flops. This causes the positive margin if any (i.e., the net positive time differential between $t_{req}$ and the actual arrival time $t_{arr}$) to accumulate at the driver $v_d$ with no margin at the receivers $s_1$ and $s_2$. Having positive margins accumulate at the driver or at the intermediate flip-flops between the driver and the receiver is inefficient as the positive margins are unavailable for circuit design, particularly if time constraints at the receiver are critical.

Example embodiments of the present invention are illustrated in the accompanying drawings. The accompanying drawings, however, do not limit the scope of the present invention. Similar references in the drawings indicate similar elements.

BRIEF DESCRIPTION OF THE DRAWINGS

FIG. 4 illustrates pseudo-code for flip-flop insertion in a circuit according to one embodiment of the invention.

FIG. 5 illustrates pseudo-code to merge candidate solutions from one or more children of a node according to one embodiment of the invention.

FIG. 6 illustrates pseudo-code for a pruning method according to one embodiment of the invention.

FIG. 7 illustrates a computer system for inserting flip-flops or flip-flops and buffers according to one embodiment of the invention.

DETAILED DESCRIPTION

Described are a method and apparatus to insert flip-flops in a circuit design. In one embodiment of the invention, a method for inserting flip-flop(s) in a circuit design between a driver and one or more receivers, given latency constraints at the receiver(s), comprises determining whether to insert a flip-flop at a node in the circuit. And, inserting the flip-flop at the node in the circuit to satisfy the latency constraints and simultaneously maximize a positive margin at the driver and a positive margin at the receiver. In addition to simultaneously maximizing the positive margin at the driver and the receiver, wiwn a plurality of flip-flops are inserted in the circuit between the driver and the receiver, each flip-flop is inserted such that the time delay between adjacent flip-flops along a path from the driver to the receiver is substantially equal to a clock period.

In one embodiment of the invention, when the flip-flops are inserted in the circuit design, the wire delay with repeaters is computed and the computed wire delay is used in the placement of flip-flops in the circuit design.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to effect such feature, structure, or characteristic in connection with other embodiments whether or not explicitly described. Parts of the description are presented using terminology commonly employed by those of ordinary skill in the art to convey the substance of their work to others of ordinary skill in the art.

In the following description and claims, the terms "coupled" and "connected", along with derivatives such as "communicatively coupled" may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct physical contact with each other, but still co-operate or interact with each other.

Figure 1:
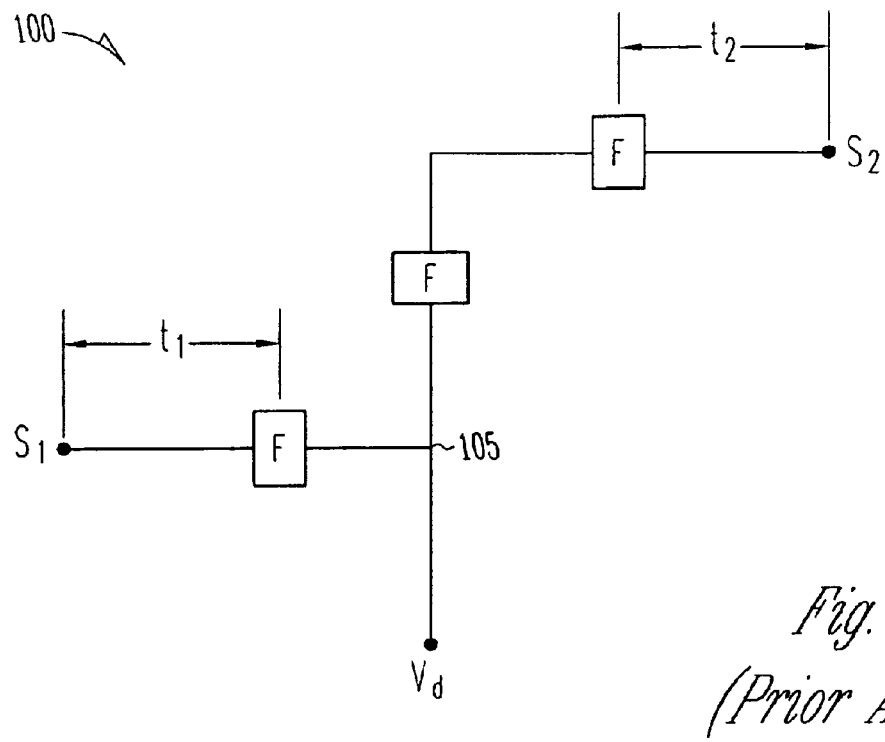
FIG. 1 illustrates flip-flops placed in a circuit using a conventional flip-flop insertion method.
Figure 2:
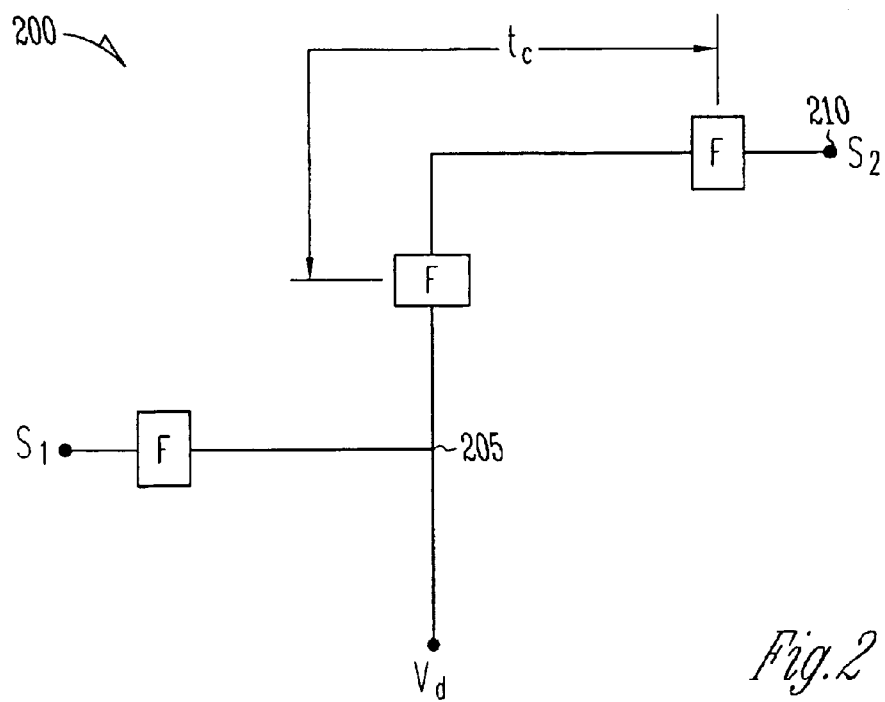
FIG. 2 illustrates flip-flops placed in a circuit using a flip-flop insertion method according to one embodiment of the invention.
Figure 3:
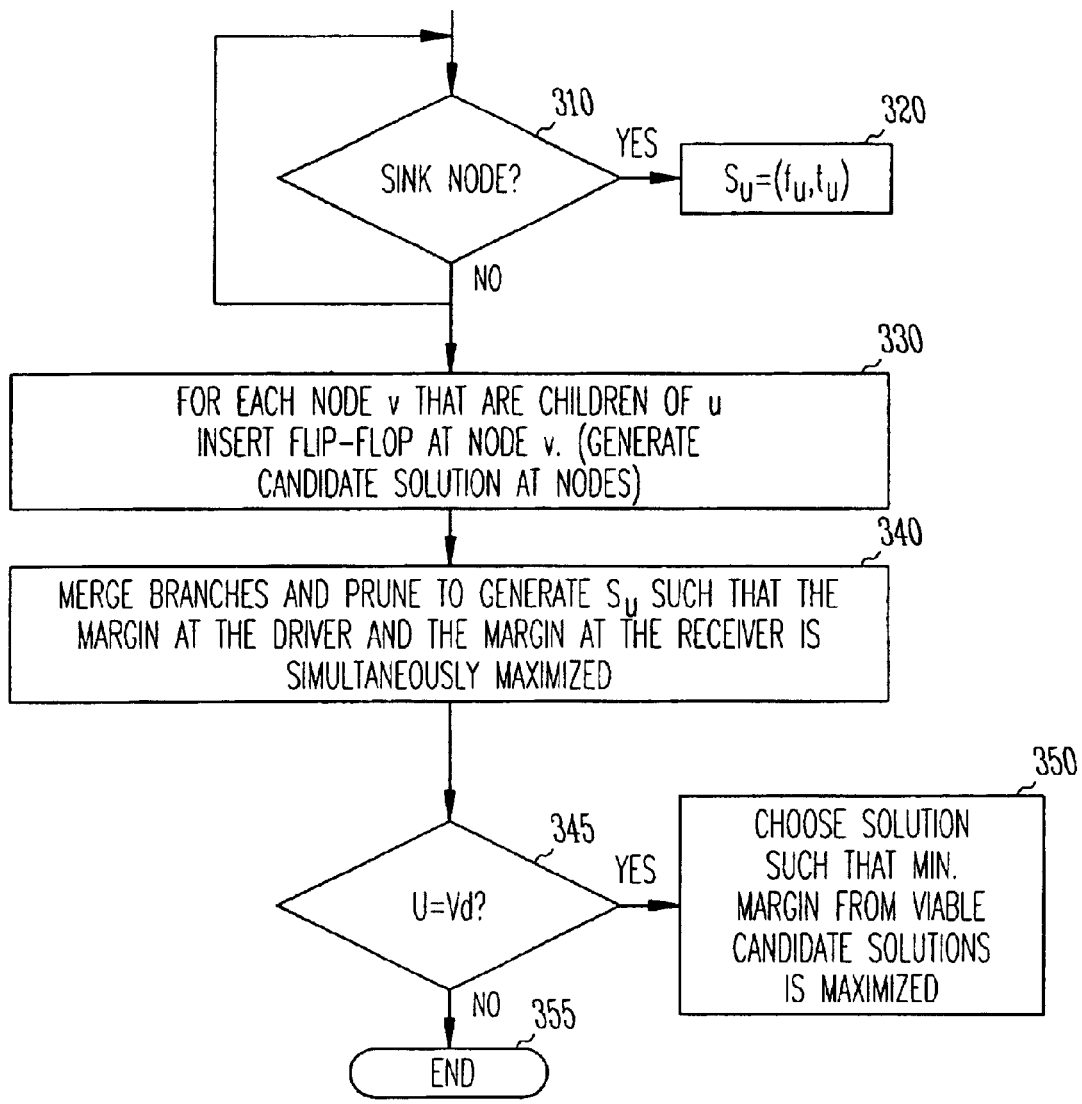
FIG. 3 illustrates a flow diagram for inserting flip-flops in a circuit according to one embodiment of the invention.

FIG. 2 illustrates flip-flops placed in a circuit using a flip-flop insertion method according to one embodiment of the invention. As illustrated in FIG. 2, flip-flops are inserted in the circuit such that the positive margin is simultaneously maximized at the driver $v_d$ and at the receivers $s_1$ and $s_2$. In addition, whenever possible the time delay between flip-flops along a path is substantially equal to a clock period (i.e., the margin at each flip-flop is substantially 0). Thus, as illustrated in FIG. 2, the time delay between the two flip-flops on the path $p(v_d, s_2)$ is equal to the clock period. FIG. 3 illustrates a flow diagram for inserting flip-flops in a circuit according to one embodiment of the invention. FIG. 4 illustrates the pseudo-code for flip-flop insertion in a circuit according to one embodiment of the invention. For FIGS. 3 and 4, T=(V, E) is a routing tree that describes a net topology (circuit). T contains a set of n nodes with V={$v_d$∪SN∪STN} where $v_d$ is a source node, SN={$s_1, s_2 \ldots s_n$} is a set of sink and STN is a set of Steiner nodes (i.e., a node other than a source or a sink node). For n nodes, E is a set of n−1 edges that correspond to wire segments between the nodes such that each wire segment (edge) e=(u,v)∈E is a directed edge from u to v indicating that the signal propagates from u to v. For an edge e=(u,v), src(e)=u and dest(e)=v. For a node u, let $T_u$ be a sub tree with a root at u and children(u)={v such that ∃e ∈E and src(e)=u, dest(e)=v}. A path p(u,v) from node u to node v is an ordered subset of edges $(u,u_1), (u_1,u_2), \ldots (u_k,v)$ of E. The nodes $u_i$, $1 \leq i \leq k$ define the internal nodes of the path p(u,v). Each Steiner node in the tree is a valid node for placement of a flip-flop. A node wherein placement of a flip-flop is evaluated is referred to as a candidate node.

For the circuit described above, RTL specifications provide the following constraints. The latency constraint at each receiver (i.e., the number of flip-flops required on the path from the driver to the receiver), the required arrival time, $t_{req}$, at each receiver (as measured from the driver), the clock period, and the flip-flop setup/propagation time.

In one embodiment of the invention, the flip-flop insertion method assigns flip-flops in the circuit such that the assignment of flip-flops to the candidate nodes satisfies the latency constraints between the driver and the receivers. One or more assignments of flip-flops to the candidate nodes may satisfy the given latency constraints, and each assignment of flip-flops satisfying the latency constraints is a viable candidate solution. Each viable candidate solution results in a distribution of margin at the flip-flops, at the driver, and at the receiver. In one embodiment of the invention, a metric for measuring the optimal flip-flop assignment is the minimum value of the margin at the driver and receiver. Therefore, for a flip-flop assignment satisfying the latency constraints, the minimum value of the margin at the driver and the receiver is compared with the minimum value of the margin for another assignment of flip-flops that also satisfies the latency constraints. The optimal flip-flop assignment is one wherein this minimum value of the margin is maximized (i.e., wherein the minimum value of the margin is the greatest). In one embodiment of the invention, maximizing the minimum value of the margin results in the positive margin at the driver being substantially equal to the positive margin at the receiver, thus, maximizing the minimum margin simultaneously at the driver and the receiver. In one embodiment of the invention, an optimal assignment of the flip-flops results in not only simultaneously maximizing the margin at the driver and the receiver, but also, in the margin at one or more flip-flops along the path from the driver to the receiver being substantially zero.

In one embodiment of the invention, to insert flip-flops in the circuit as stated above (without the addition of buffers), the wire delay is initially determined. Although, one method for obtaining the wire delay (i.e., the delay due to the wire and repeaters (if any) associated with each edge (wire segment)) is illustrated, one having ordinary skill in the art will appreciate that any other model may be used to calculate the wire delay.

For an unrepeated wire (i.e., a wire without repeaters e.g., buffers, inverters, etc.) with length l, the wire delay is proportional to $r.c.l^2$, where r is the resistance per unit length, and c is the capacitance per unit length. The wire delay for a repeated wire (i.e., a wire with buffers, inverters etc.) is proportional to r.c.l. The RC content of a wire (RCcontent)=$r.c.l^2$. Since RCcontent for a repeated wire and an unrepeated wire is approximately the same, the buffered wire delay is proportional to $\sqrt{RCcontent}$.

In one embodiment of the invention, the wire delay includes the time required by a signal to propagate through one or more repeaters. The maximum unrepeated distance for a wire is computed, repeaters are added to this length of wire and the delay across the wire with repeaters added is computed. Thus, the computed wire delay with repeaters for a plurality of wire lengths having a corresponding plurality of RCcontents is calculated. The computed wire delays corresponding to the plurality of RCcontents are fitted to a curve using a linear equation to obtain the wire delay for any given length of wire (which may be required to calculate the $t_{req}$) along a buffered interconnect path. In line 12 of FIG. 4, the wire delay is computed by calling function e.g., Bufferdelay(e).

Candidate solutions in the form of (f,t) pairs are associated with each node in the circuit. In one embodiment of the invention, the candidate solutions are generated starting at each receiver s and ending at the source $v_d$. In particular, a candidate solution (f,t) associated with node u reflects an assignment of flip-flops to the nodes of $T_u$ such that the number of flip-flops required on the path $p(v_d, u)$ is f, and the required arrival time of a signal from $v_d$ to u is t. In one embodiment of the invention, candidate solutions are computed in a bottom-up fashion. One having ordinary skill in the art will appreciate, at a node u candidate solutions are generated from the sets of solutions that have already been computed at the nodes belonging to children (u). At the driver, all candidate solutions (f, t) with f=0 represent valid assignment of flip-flops that satisfy the latency constraints at the receiver(s). From the several valid assignments of flip-flops, the optimum solution wherein the minimum value of the margin at the driver and the receiver is maximized is obtained.

In one embodiment of the invention, candidate solutions at each node u are generated by computing a required arrival time for the signal at u and a flip-flop count requirement upstream of u. At u, candidate solutions from the nodes belonging to children (u) are merged. This set of candidate solutions is represented by the set $S_u^\Phi$. For each candidate solution (f, t) that belongs to $S_u^\Phi$, if f is not equal to zero, a new candidate solution corresponding to placing a flop at u is generated. When flip-flop placement is considered at a node, the associated candidate solution is augmented with an entry indicating the margin at the flip-flop.

In one embodiment of the invention, at 310 of FIG. 3 and as illustrated in the pseudo-code of FIG. 4 lines 1–4, a determination is made at a node to determine if the node is a sink node or a Steiner node. If the node is a sink node u (e.g., node 210 of FIG. 2), at 320, a single candidate solution $S_u = (f_u, t_u)$ is generated where $f_u$ is the required number of flip-flops on the path $(v_d, u)$ and $t_u$ is the $t_{req}$ for the signal at u. If the node is not a sink node, flip-flop assignment is first evaluated at the nodes downstream of u. Next, at lines 7–13 of FIG. 4, and at 330 of FIG. 3 candidate solutions $S_u^\Phi$ are generated. In lines 14–19 of FIG. 4, flip-flop insertion is evaluated at u and the candidate solution set $S_u^\Delta$ is generated. The candidate solution set $S_u^\Delta$ may comprise of inferior solutions, and the inferior solutions are eliminated by a pruning method discussed with respect to FIG. 6. For a node u, $S_u$ is defined as the final set of candidate solutions at u and is the union of $S_u^\Phi$ and $S_u^\Delta$. During the propagation of the solutions up the routing tree, at each node u a determination is made whether or not a flip-flop is to be inserted at the node based upon the solution that has been generated downstream of u. This determination is made at line 16 of the flop-insertion pseudo-code of FIG. 4. f=0 indicates that the flip-flops needed to meet the latency constraints have been assigned to the nodes downstream of u and no more flip-flops are required on the path from the driver to u. If f>0, a candidate solution corresponding to placing a flip-flop at u is generated and added to $S_u^\Delta$ as illustrated in line 19 of FIG. 4. To simplify the explanation, the flip-flop setup and propagation time is ignored. The new candidate solution requires f–1 more flip-flops on the path $p(v_d, u)$ after accounting for the flip-flop inserted at u. The placement of a flip-flop at u determines an arrival time for the signal at u (i.e., flop_rat) as seen in line 17 of the pseudo-code of FIG. 4. At line 18 of the pseudo-code of FIG. 4 the margin is calculated as illustrated. At node u, $t_{req}$ is propagated up from nodes that are downstream of u. When a flip-flop is placed at u an arrival time constraint $t_{arr}$ is associated with the flip-flop. The margin at the flip-flop flop is therefore, $m = t_{req} - t_{arr}$. At line 19 of the flip-flop insertion pseudo-code, an augmented candidate solution that includes the margin m is constructed.

FIG. 5 illustrates pseudo-code to merge candidate solutions from one or more children of a node according to one embodiment of the invention. If one or more paths from the driver, branch as illustrated by paths $p(v_d, s_1)$ and $p(v_d, s_2)$ of FIG. 2, a merge algorithm merges candidate solutions as illustrated in FIG. 5 and 340 of FIG. 3. For a node w with children (w)≠Φ, candidate solutions from all the nodes in children (w) are merged as follows. Given node w with two children u and v, candidate solutions $s_1 \in S_u$ and $s_v \in S_v$ are propagated up toward the branch node 205 from u and v, and merged at w. The candidate solutions $s_u$ and $s_v$ have been previously calculated as illustrated with respect to the flow diagram and pseudo-code of FIGS. 3 and 4 respectively. First a solution set $S_w^\Phi$ is generated by merging candidate solutions $s_u$ and $s_v$ if the latency entries of the candidate solutions $s_u$ and $s_v$ are equal. Returning to FIG. 2, consider the path $p(v_d, s_1)$. The latency constraint for this path is one flip-flop. If a first flip-flop is placed downstream of node 205, no more flip-flops can be placed on the path $p(v_d, s_1)$, otherwise the 1 flip-flop constraint for this path is violated. For path $p(v_d, s_2)$ the latency constraint is 2 flip-flops. If two flip-flops are placed downstream of the branch node 205, no more flip-flops can be placed on the path $p(v_d, s_2)$ upstream of 205, else the latency constraints will be violated. Let the branch node 205 be the node at which candidate solutions from the two paths $p(v_d, s_1)$ and $p(v_d, s_2)$ are merged. Let $s_u$ be a candidate solution propagated up along $p(v_d, s_1)$ and $s_v$ be a candidate solution propagated along path $p(v_d, s_2)$. If the latency constraints in $s_u$ and $s_v$ at the branch node 205 are both 1, it means that no flip-flop has been placed along $p(v_d, s_1)$ and 1 flop has been placed along path $p(v_d, s_2)$. One having ordinary skill in the art will appreciate that the latency constraint in a candidate solution starts with given constraint and when a flip-flop is placed in the routing tree the latency constraint in the candidate solution is decremented as illustrated in line 19 in FIG. 4. This means that $s_u$ and $s_v$ can be merged and the required flip-flop can be placed on the path from the driver to the branch node 205, thereby satisfying the latency constraints at both receivers. If the latency constraints in $s_u$ and $s_v$ at the branch node 205 are 0, it means that 1 flop has been placed on the left branch and two flip-flops have been placed along path $p(v_d, s_2)$. $s_u$ and $s_v$ can be merged and no more flops need to be placed on the path from the driver to the branch node 205. Thus, the sub solutions $s_u$ and $s_v$ are merged only if the latency entries are equal. If the latency entries f of the candidate solutions $s_u$ and $s_v$ are unequal (illustrated by lines 7 and 8 of the pseudo-code of FIG. 5), a candidate solution at u corresponding to the sub-solutions $s_u$ and $s_v$ is not generated. After a candidate solution at w is computed in accordance with the merge procedure, it is added to $S_w^\Phi$. Flip-flop assignment is now considered at w and $S_w^\Delta$ is generated. The candidate solutions at w, belonging to the set $S_w^\Delta$ are assigned to different bins defined by the sets $S_{w,k}$. $S_{w,k}$ is defined as the set of candidate solutions corresponding to placing a flip-flop at w and resulting in a latency requirement of k at w. The candidate solutions in each bin are pruned such that each bin is left with a single entry. Thus, the solution set $S_w = S_w^\Phi \forall S_w^\Delta$ is obtained after merging and pruning the candidate solutions.

FIG. 6 illustrates pseudo-code for a pruning method according to one embodiment of the invention. The pruning method illustrated in FIG. 6 and at 340 of FIG. 3 eliminates inferior solutions from the set of candidate solutions after inserting flip-flops at nodes. In one embodiment of the invention the pruning method ensures that the margin at each inserted flip-flop is substantially zero, and the margin at both the driver and the receiver is maximized.

Suppose f flip-flops are to be placed on the path $p(v_d, u)$. At nodes where flip-flops are assigned and at the driver $v_d$, margins are associated with the solution pair (f,t) to form augmented candidate solutions of the form (f,t;m) where m is the margin. As stated earlier candidate solutions are propagated up the routing tree (from the receiver to the driver) in a bottom up manner generating new candidate solutions at each node. By pruning candidate solution set $S_u^\Delta$, flip-flops may be inserted in the routing tree T in polynomial time. Given a constraint (f,t) at the sink node s, the optimal solution according to one embodiment of the invention ensures the interconnect delay for the paths $p(u_i, u_{i+1})$, $1 \leq i < f$ is about a clock cycle. This means that the margin at the flip-flops is approximately 0. In addition, the optimal solution ensures the margins at the driver and the receiver is maximized. If f=1, the given flip-flop is placed such that the margin at the driver and the receiver is approximately equal, thereby maximizing the minimum margin at the driver and the receiver. In one embodiment of the invention, after pruning the candidate solutions to ensure that the margin at each flip-flop is substantially zero, the candidate solutions that do not ensure the margins at the flops are substantially zero are pruned.

Consider a node u and the solution set $S_u^\Delta$. The entries in $S_u^\Delta$ can be placed into different bins depending on the constraint f seen by the nodes upstream of u. Consider two entries $s_1=(f_1,t_1;m_1)$ and $s_2=(f_2,t_2;m_2)$. If $f_1=f_2$, then $t_1=t_2$ (asseen in line 17 of FIG. 4). Considering margins $m_1$ and $m_2$. If both the margins are positive and $m_1 > m_2$, then $s_1$ is an inferior solution compared with $s_2$. This is because the margin at the flip-flops should be substantially zero, and the positive margin in the interconnect can be distributed at the driver and receivers. If $m_1<0$ and $m_2>0$, then $s_1$ is inferior, and if $m_1<0$ and $m_2<0$, and $m_1<m_2$, $s_1$ is inferior. The inferior solution is removed from $S_u^\Delta$. This is illustrated in FIG. 6. After pruning, there is a single (f, t) entry in $S_u^\Delta$ for each distinct value of f.

Without pruning the total number of candidate solutions generated by the flip-flop insertion method described with respect to FIGS. 2–5 is $$\binom{n}{f}.$$

Thus, the method evaluates possible assignments of f flip-flops to n nodes. Pruning restricts the number of candidate solutions evaluated. Consider a circuit with a driver and a single receiver with f flip-flops required on the path from the driver to the receiver. Consider a node u with children (u)={v} and $|S_v|$=m. Without pruning, $S_u^\Phi = S_u^\Delta$=m, and with pruning $|S_{u,k}|$=1, $1 \leq k \leq f$. Therefore, the maximum number of candidate solutions in $S_u^\Delta$ is f and $|S_u|$=m+f. The total number of candidate solution pairs at u is at the most f more than the number of solution pairs at v. Initially, a single candidate solution (i.e., a (f,t) pair) exists at each receiver. The total number of candidate solutions evaluated is $1+f+2f+3f+\ldots =1+f\Sigma i=O(n^2 f)$. The solution sets $S_u$ are maintained in order latency and margin and are implemented using a search-tree data structure e.g., a Red-black tree well known by one having ordinary skill in the art. The maximum number of potential candidate solution pairs at any node is nf, and the method to merge candidate solutions to generate solution set $S_u^\Phi$, illustrated in FIG. 5, may be performed in linear time. Adding the merged pairs to the solution set $S_u^\Phi$ takes less than O(n lg n) time assuming O(lg n) time for adding each solution pair to $S_u^\Phi$. Constructing $S_u^\Phi$ and $S_u^\Delta$ may be achieved in O(n lg n) time.

Pruning the set $S_u^\Delta$ may be accomplished by identifying sub optimal solution pairs in a linear pass over $S_u^\Delta$, since $S_u^\Delta$ is sorted by latency and margin. Each such non-optimal solution may be deleted from $S_u^\Delta$ in logarithmic time. Processing at each node takes at most O(n lg n) time with the worst case being $O(n^2$ lg n) time.

At a merge node u with greater than one child, let $v \in$ children(u) be the node such that $|S_v|$ is minimum. The maximum number of candidate solutions in $S_u^\Phi$ is $|S_v|$ because the latency constraints from different branches need to match for the merge to occur. For a multi pin net, the total number of candidate solution pairs at any node will be at the most F more than $|S_v|$, where F is the maximum number of flops required on any driver-receiver path. The maximum number of candidate solutions at u is O(nF). If $\Phi_u$ is the degree of node u, the algorithm takes $O(\Phi_u n$ lg n) time at node u. Assuming the degree of any node in the graph is bounded by a constant, the overall complexity of the algorithm is $O(n^2$ lg n). At 345 of FIG. 3, after merging branches and pruning candidate solutions a decision is made whether the node u is the driver. If the node u is the driver then from the viable candidate solutions at the driver the arrangement of flip-flops is chosen such that the minimum margin at the driver and the receiver is maximized. If the node u is not the driver at 355 the process ends.

The method illustrated in FIGS. 3–6 for insertion of flip-flops in circuits may be extended to enable simultaneous flip-flop and buffer insertion in circuits as follows. For buffer insertion, the candidate solutions are represented by load and required time, or (c,t) pairs. Let $B_u$ be a set of candidate solutions at node u for insertions of buffers. If $(c,t) \in B_u$, then there exists an assignment of buffers to $T_u$ with upward load c and required arrival time t at u. It is well known by one having ordinary skill in the art that if (c,t) and $(c',t') \in B_u$, and if $c' \geq c$ and $t' < t$ then (c',t') is a sub-optimal solution, because a larger load worsens the delay at upstream nodes.

Let $(c_s,t_s)$ represent a candidate solution at a sink node s where $c_s$, $t_s$ are the input capacitance and the required arrival time. Candidate solutions are propagated up the routing tree from the sink nodes. For simplicity, only a single buffer b is inserted at each Steiner node. One having ordinary skill in the art will appreciate that multiple buffer types may be evaluated for insertion at each Steiner node. Let $B_u$ be the set of all candidate solutions for a particular node u generated by merging the solutions propagated up from children(u). Let (c,t) be the solution in $B_u$ such that $t-delay_b(c) > t'-delay_b(c')$ for all $(c', t') \in B_u$, where $delay_b(c)$ is the delay of buffer b due to load c. A new solution pair $(c_b, t-delay_b(c))$ is added to $B_u$ where $c_b$ is the input capacitance of the buffer b. $B_u$ is then pruned to eliminate sub-optimal solutions using the rule described above.

In one embodiment of the invention, by simultaneously inserting flip-flops and buffers, the need to calculate the buffered line delays for inserting flops independently is eliminated. To simultaneously insert flip-flops and buffers, two sets of candidate solutions are maintained at each node u. One set of candidate solutions to propagate buffer solutions and the other to propagate flip-flop solutions. Let the two sets of candidate solutions be $B_u$ and $S_u$ respectively. Each set of candidate solutions are pruned according to the respective pruning rules. When a buffer is inserted at a node u, the required arrival time is adjusted by the delay across the buffer, and the nodes upstream of u see the input capacitance of the buffer. Inserting a flip-flop at u sets the required arrival time to a multiple of the clock period (ignoring the flip-flop setup time) and the nodes upstream of u see the input capacitance of the flip-flop and the required arrival time at the flip-flop input.

In one embodiment of the invention, for node u the buffer candidate solution set $B_u$ is first generated followed by the flop candidate solution $S_u$. For each (c,t) pair in $B_u$ that does not involve buffer insertion at u, a flip-flop placement at u is considered and a corresponding flip-flop solution pair is generated and added to the flip-flop solution set $S_u$. For each pair $(f,t) \in S_u^\Delta$ that involves placing a flip-flop at u an additional buffer candidate solution $(c_f, t)$ is generated and added to buffer solution set $B_u$, where $c_f$ is the input capacitance of the flip-flop. The algorithm propagates the solution sets $S_u$ and $B_u$ upstream toward the source node. At the source node a viable solution is obtained with f=0 to simultaneously maximize the minimum margin at the driver and the receiver. In one embodiment of the invention, in a top-down traversal, the flip-flop and buffers corresponding to that solution may be reported.

FIG. 7 illustrates a computer system for inserting flip-flops or flip-flops and buffers according to one embodiment of the invention. In general, the computer system 700 may comprise a processing unit 702 communicatively coupled through a bus 701 to system memory 713, mass storage devices 707, Input devices 706, display device 705 and network devices 708.

Bus 701 may be any of several types of bus structures including a memory bus, a peripheral bus, and a local bus using any of a variety of bus architectures. System memory 713 comprises a read only memory (ROM) 704 and random access memory (RAM) 703. ROM 704 comprises basic input output system (BIOS) 716. BIOS 716 contain the basic routines, e.g., start up routines, that facilitate the transfer of information between elements within computer system 700. RAM 703 includes cache memory and comprises operating system 718, application programs 720, and program data 724. Application programs 720 include the program code for implementing the method to insert flip-flops and/or buffers in a circuit design as described with respect to FIGS. 2–6 above. Program data 724 may include data generated by application programs 720. Mass storage device 707 represents a persistent data storage device, such as a floppy disk drive, fixed disk drive (e.g., magnetic, optical, magneto-optical, or the like), or streaming tape drive. Mass storage device 707 may store application programs 728, operating system 726 for computer system 700, and program data 730. Application programs 728 and program data 730 stored on mass storage devices 707 may include the application programs 720 and program data 724 stored in RAM 703. One embodiment of the invention may be stored entirely as a software product on mass storage device 707. Embodiments of the invention may be represented as a software product stored on a machine-readable medium (also referred to as a computer-accessible medium, a machine-accessible medium, or a processor-accessible medium). The machine-readable medium may be any type of magnetic, optical, or electrical storage medium including a diskette, CD-ROM, memory device (volatile or non-volatile), or similar storage mechanism. The machine-readable medium may contain various sets of instructions, code sequences, configuration information, or other data. Those of ordinary skill in the art will appreciate that other instructions and operations necessary to implement the described invention may also be stored on the machine-readable medium. One embodiment of the invention may be embedded in a hardware product, for example, in a printed circuit board, in a special purpose processor, or in a specifically programmed logic device communicatively coupled to bus 701. Processing unit 702 may be any of a wide variety of general-purpose processors or microprocessors (such as the Pentium® processor family manufactured by Intel® Corporation), a special purpose processor, or a specifically programmed logic device. Processing unit 702 is operable to receive instructions which, when executed by the processing unit cause the processing unit to execute application programs 720.

Display device 705 is coupled to processing unit 702 through bus 701 and provides graphical output for computer system 700. Input devices 706 such as a keyboard or mouse are coupled to bus 701 for communicating information and command selections to processing unit 702. Other input devices may include a microphone, joystick, game pad, scanner, or the like. Also coupled to processing unit 702 through bus 701 is an input/output interface (not shown) which can be used to control and transfer data to electronic devices (printers, other computers, etc.) connected to computer system 700. Computer system 700 includes network devices 708 for connecting computer system 700 to one or more remote devices (e.g., the receiving node) 712 via network 714. Remote device 712 may be another personal computer, a server, a router, a network PC, a wireless device or other common network node and typically includes one or more of the elements described above with respect to computer system 700. Network devices 708, may include a network interface for computer system 700, Ethernet devices, network adapters, phone jacks, modems, and satellite links. It will be apparent to one of ordinary skill in the art that other network devices may also be utilized.

Thus, a method and apparatus for inserting flip-flops in a circuit design has been disclosed. While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method for inserting a flip-flop at a node in a circuit design between a driver and a receiver comprising:

generating a candidate solution to assign the flip-flop at the node in the circuit; calculating a minimum margin at the driver; calculating a minimum margin receiver; and inserting the flip-flop at a node between the driver and receiver to simultaneously maximize the minimum margin at the driver and the minimum margin at the receiver.

2. The method of claim 1 further comprising:

determining whether to insert a second flip-flop at a second node in the circuit; and inserting the second flip-flop at the second node in the circuit such that a delay between the flip-flop and the second flip-flop is substantially equal to a clock period.

3. The method of claim 2 further comprising generating an augmented candidate solution at each node in the circuit, the augmented candidate solution comprising a margin.

4. The method of claim 1 further comprising calculating a wire delay and using the wire delay to calculate the minimum margin at the driver, the minimum margin at the receiver, and a margin at the node.

5. The method of claim 4 further comprising inserting a buffer in the circuit and recalculating the wire delay with the buffer inserted.

6. The method of claim 1 wherein the minimum margin comprises a difference in time between a required arrival time and an actual arrival time of a signal.

7. A method for inserting one or more flip-flops in a circuit design between a driver and a receiver comprising:

assigning a first set of one or more flip-flops to a selected first set of one or more nodes in the circuit depending on specified latency constraints to form a first arrangement of flip-flops;

determining a minimum margin at the driver and a minimum margin at the receiver for the first arrangement of flip-flops;

assigning a second set of one or more flip-flops to a selected second set of one or more nodes in the circuit depending on the specified latency constraints to form a second arrangement of flip-flops;

determining a minimum margin at the driver and a minimum margin at the receiver for the second arrangement of flip-flops;

comparing the minimum margin for the first arrangement of flip-flops and the second arrangement of flip-flops; and selecting the arrangement of flip-flops in the circuit design having the greatest minimum margin.

8. The method of claim 7 further comprising arranging flip-flops in the selected arrangement of flip-flops so that the time taken for a signal to propagate from one flip-flop to another flip-flop along a path in the circuit is substantially equal to a clock period.

9. The method of claim 7 further comprising merging the arrangement of flip-flops from a first branch and a second branch in the circuit.

10. The method of claim 7 wherein determining a minimum margin at the driver and the receiver comprises calculating a wire delay, and using the wire delay to calculate the minimum margin.

11. The method of claim 10 further comprising inserting a buffer in the circuit and recalculating the wire delay with the buffer inserted.

12. A system for inserting a flip-flop in a circuit design between a driver and a receiver comprising:
   a memory;
   a processor; and
   a bus coupled to the memory and the processor the processor to generate a candidate solution to assign the flip-flop at a node between the driver and receiver in the circuit, calculate a minimum margin at the driver, calculate minimum the margin at the receiver, and insert the flip-flop at the node to simultaneously maximize the minimum margin at the driver and a minimum margin at the receiver.

13. The system of claim 12 further comprising the processor to
   determine whether to insert a second flip-flop at a second node in the circuit; and
   insert the second flip-flop at the second node in the circuit such that a delay between the flip-flop and the second flip-flop is substantially equal to a clock period.

14. The system of claim 13 further comprising, the processor to generate an augmented candidate solution at each node in the circuit, the augmented candidate solution comprising a margin.

15. The system of claim 12 further comprising, the processor to calculate a wire delay and use the wire delay to calculate the minimum margin at the driver, the minimum margin at the receiver, and a margin at the node.

16. The system of claim 15 further comprising the processor to use the wire delay to determine whether to insert a buffer in the circuit between the driver and the receiver.

17. The system of claim 15 further comprising the processor to calculate a wire delay and use the wire delay to calculate the minimum margin at the driver, the minimum margin at the receiver, and a margin at the node.

18. The system of claim 17 further comprising the processor to insert a buffer in the circuit and to recalculate the wire delay with the buffer inserted.

19. An article of manufacture for inserting a flip-flop in a circuit design between a driver and a receiver comprising:
   a machine-accessible medium including instructions that, when executed by a machine, causes the machine to perform operations comprising
   generating a candidate solution to assign the flip-flop at the node in the circuit;
   calculating a minimum margin at the driver; calculating a minimum margin at the receiver; and
   inserting the flip-flop at the node to simultaneously maximize the minimum margin at the driver and the minimum margin at the receiver.

20. The article of manufacture of claim 19 further comprising instructions for:
   determining whether to insert a second flip-flop at a second node in the circuit; and
   inserting the second flip-flop at the second node in the circuit such that a delay between the flip-flop and the second flip-flop is substantially equal to a clock period.

21. The article of manufacture of claim 20 further comprising instructions for generating an augmented candidate solution at each node in the circuit, the augmented candidate solution comprising a margin.

22. The article of manufacture of claim 20 further comprising instructions for
   calculating a wire delay and using the wire delay to calculate the minimum margin at the driver, the minimum margin at the receiver, and a margin at the node.

23. The article of manufacture of claim 22 further comprising instructions for inserting a buffer in the circuit and for recalculating the wire delay with the buffer inserted.

* * * * *

UNITED STATES PATENT AND TRADEMARK OFFICE
CERTIFICATE OF CORRECTION

PATENT NO. : 6,910,195 B2
DATED : June 21, 2005
INVENTOR(S) : Nataraj Akkiraju

It is certified that error appears in the above-identified patent and that said Letters Patent is hereby corrected as shown below:

Column 10,
Line 21, after "margin" insert -- at the --.

Column 11,
Line 20, after "processor" insert -- , --.
Line 24, delete "minimum the margin" and insert -- a minimum margin --, therefor.
Line 26, delete "a" and insert -- the --, therefor.

Signed and Sealed this

Twenty-ninth Day of November, 2005

JON W. DUDAS
*Director of the United States Patent and Trademark Office*